(12) United States Patent
Kumar et al.

(10) Patent No.: US 9,054,657 B2
(45) Date of Patent: Jun. 9, 2015

(54) REDUCING A SETTLING TIME AFTER A SLEW CONDITION IN AN AMPLIFIER

(71) Applicant: Texas Instruments Incorporated, Dallas, TX (US)

(72) Inventors: Vaibhav Kumar, Tucson, AZ (US); Vadim Valerievich Ivanov, Denton, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 82 days.

(21) Appl. No.: 14/040,856

(22) Filed: Sep. 30, 2013

(65) Prior Publication Data

US 2015/0091647 A1 Apr. 2, 2015

(51) Int. Cl.
*H03F 3/45* (2006.01)

(52) U.S. Cl.
CPC .. *H03F 3/45179* (2013.01); *H03F 2003/45008* (2013.01); *H03F 2203/45248* (2013.01); *H03F 2203/45344* (2013.01); *H03F 2203/45511* (2013.01)

(58) Field of Classification Search
USPC .......................................... 330/153, 310, 257
IPC ........................................... H03F 3/45017,3/04
See application file for complete search history.

(56) References Cited

U.S. PATENT DOCUMENTS

| 4,570,128 | A | | 2/1986 | Monticelli | |
|---|---|---|---|---|---|
| 4,851,786 | A | * | 7/1989 | Vinn et al. | 330/252 |
| 5,327,100 | A | * | 7/1994 | Stockstad et al. | 330/255 |
| 6,359,512 | B1 | | 3/2002 | Ivanov et al. | |
| 6,437,645 | B1 | | 8/2002 | Ivanov et al. | |
| 8,217,721 | B1 | * | 7/2012 | Hsieh | 330/255 |
| 8,390,379 | B2 | | 3/2013 | Snoeij et al. | |
| 2002/0109547 | A1 | * | 8/2002 | Ivanov et al. | 330/255 |
| 2002/0158691 | A1 | * | 10/2002 | Blankenship et al. | 330/253 |
| 2005/0285676 | A1 | | 12/2005 | Jones | |
| 2009/0102560 | A1 | * | 4/2009 | Harvey | 330/257 |
| 2012/0086509 | A1 | * | 4/2012 | Snoeij et al. | 330/257 |
| 2014/0266435 | A1 | * | 9/2014 | Botker | 330/253 |

* cited by examiner

*Primary Examiner* — Patricia T Nguyen
(74) *Attorney, Agent, or Firm* — Michael A. Davis, Jr.; Frank D. Cimino

(57) ABSTRACT

In an amplifier, a first stage receives a differential input voltage, which is formed by first and second input voltages, and outputs a first differential current in response thereto on first and second lines having respective first and second line voltages. A second stage receives the first and second line voltages and outputs a second differential current in response thereto on third and fourth lines having respective third and fourth line voltages. A third stage receives the third and fourth line voltages and outputs an output voltage in response thereto. A slew boost circuit detects a slew condition, in which a threshold difference arises between the first and second input voltages, and outputs a slew current in response thereto for maintaining a slew rate of the output voltage during the slew condition. The first stage includes circuits for reducing a variable difference between the first and second line voltages.

20 Claims, 2 Drawing Sheets

REDUCING A SETTLING TIME AFTER A SLEW CONDITION IN AN AMPLIFIER

BACKGROUND

The disclosures herein relate in general to electronic circuitry, and in particular to reducing a settling time after a slew condition in an amplifier.

An amplifier's slew rate is a measure of a maximum rate of change of the amplifier's output voltage in response to an input step function of the amplifier's input voltage. For example, the amplifier's input voltage may be a differential input voltage. A high slew rate is generally desirable.

The amplifier may include a slew boost circuit for: (a) detecting a condition ("slew condition") in which a threshold difference arises in the differential input voltage; and (b) in response to the slew condition, generating slew current for maintaining the high slew rate. After the slew condition ends (e.g., slew current=0), the amplifier settles various currents and voltages over a period of time ("settling time") to their usual operating levels. However, in a conventional 3-stage amplifier with the slew boost circuit, the settling time may be unsuitable (e.g., 16-18 bit) for some applications, such as an analog-to-digital converter ("ADC") driver with high speed and high resolution.

SUMMARY

In an amplifier, a first stage receives a differential input voltage, which is formed by first and second input voltages, and outputs a first differential current in response thereto on first and second lines having respective first and second line voltages. A second stage receives the first and second line voltages and outputs a second differential current in response thereto on third and fourth lines having respective third and fourth line voltages. A third stage receives the third and fourth line voltages and outputs an output voltage in response thereto. A slew boost circuit detects a slew condition, in which a threshold difference arises between the first and second input voltages, and outputs a slew current in response thereto for maintaining a slew rate of the output voltage during the slew condition. The first stage includes circuits for reducing a variable difference between the first and second line voltages.

DETAILED DESCRIPTION

Figure 1:
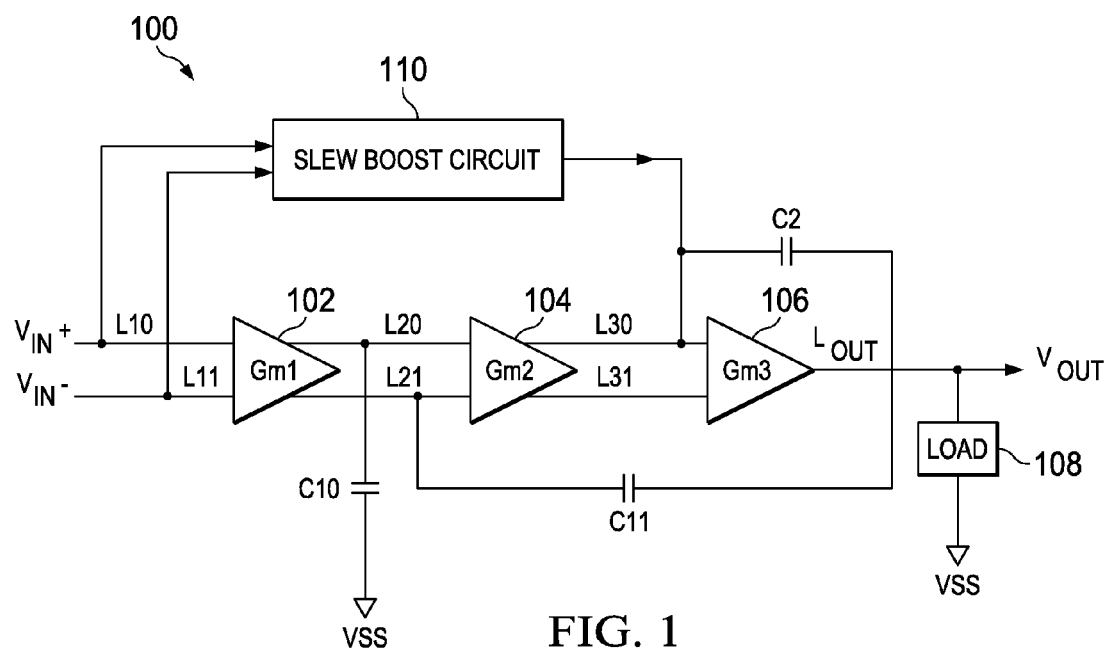
FIG. 1 is a block diagram of a 3-stage amplifier of the illustrative embodiments.

FIG. 1 is a block diagram of a 3-stage amplifier, indicated generally at 100, of the illustrative embodiments. The amplifier 100 includes first, second and third stages 102, 104 and 106, which are transconductance amplifiers whose gains are Gm1, Gm2 and Gm3, respectively. The amplifier 100 achieves high gain, with nested Miller compensation for stability.

The third stage 106 is a class AB amplifier for generating and outputting an output voltage $V_{OUT}$ on a line $L_{OUT}$, which is coupled to a voltage reference node VSS (e.g., ground) through an output load 108 whose impedance=$Z_L$. The third stage 106 applies the gain Gm3 to amplify a difference ("$\Delta V_3$") between a line L30's voltage ("$V_{30}$") and a line L31's voltage ("$V_{31}$"). Accordingly, in response to $\Delta V_3$, the third stage 106 generates $V_{OUT}=\Delta V_3*Gm3*Z_L$.

A rate of change of $V_{OUT}$ is $dV_{OUT}/dt$. The amplifier 100 receives a differential input voltage from lines L10 and L11. The amplifier 100 slew rate is a maximum $dV_{OUT}/dt$ in response to an input step function of the differential input voltage on L10 and L11.

The first stage 102 applies the gain Gm1 to amplify a difference ("$\Delta V_{IN}$") between L10's voltage ("$V_{IN}+$") and L11's voltage ("$V_{IN}-$"). Accordingly, in response to $\Delta V_{IN}$, the first stage 102 generates a difference ("$\Delta I_2$") between a line L20's current ("$I_{20}$") and a line L21's current ("$I_{21}$"), so that $\Delta I_2=\Delta V_{IN}*Gm1$. In this example: (a) if $\Delta V_{IN}$ is positive, then $\Delta I_2$ is negative; and (b) if $\Delta V_{IN}$ is negative, then $\Delta I_2$ is positive.

The second stage 104 applies the gain Gm2 to amplify a difference ("$\Delta V_2$") between L20's voltage ("$V_{20}$") and L21's voltage ("$V_{21}$"). Accordingly, in response to $\Delta V_2$, the second stage 104 generates a difference ("$\Delta I_3$") between L30's current ("$I_{30}$") and L31's current ("$I_{31}$"), so that $\Delta I_3=\Delta V_2*Gm2$. To help stabilize $V_{20}$, L20 is coupled to VSS through a capacitor C10. Through a first feedback path, $L_{OUT}$ is coupled to L21 through a capacitor C11. Through a second feedback path, $L_{OUT}$ is coupled to L30 through a capacitor C2.

If $\Delta V_{IN}$ reaches a threshold difference (e.g., 100 mV), then $\Delta I_2$ approaches its maximum limit, so that the slew condition occurs. In this example, if $\Delta V_{IN}$ is positive while reaching the threshold difference (e.g., $V_{IN}+>>V_{IN}-$), then the slew condition is positive ("positive slew condition"). Conversely, if $\Delta V_{IN}$ is negative while reaching the threshold difference (e.g., $V_{IN}+<<V_{IN}-$), then the slew condition is negative ("negative slew condition").

As shown in FIG. 1, a slew boost circuit 110 receives L10 and L11, and detects the slew condition in response thereto. In response to detecting the slew condition, the slew boost circuit 110 generates and outputs slew current ("$I_{SLEW}$") to suitably charge and discharge C2 as a compensation capacitor for maintaining a high slew rate of the amplifier 100 until the slew condition ends, so that $I_{SLEW}$=C2's capacitance multiplied by $dV_{OUT}/dt$. By comparison, in absence of the slew condition, $I_{21}$=C11's capacitance multiplied by $dV_{OUT}/dt$.

$I_{SLEW}$ causes $\Delta V_2$ to increase. After the slew condition ends ($I_{SLEW}=0$), the amplifier 100 reduces $\Delta V_2$ over a period of time ("settling time") to its usual operating level. To reduce the settling time, the first stage 102 operates to constrain $\Delta V_2$ during the slew condition, as discussed hereinbelow in connection with FIG. 2.

Figure 2:
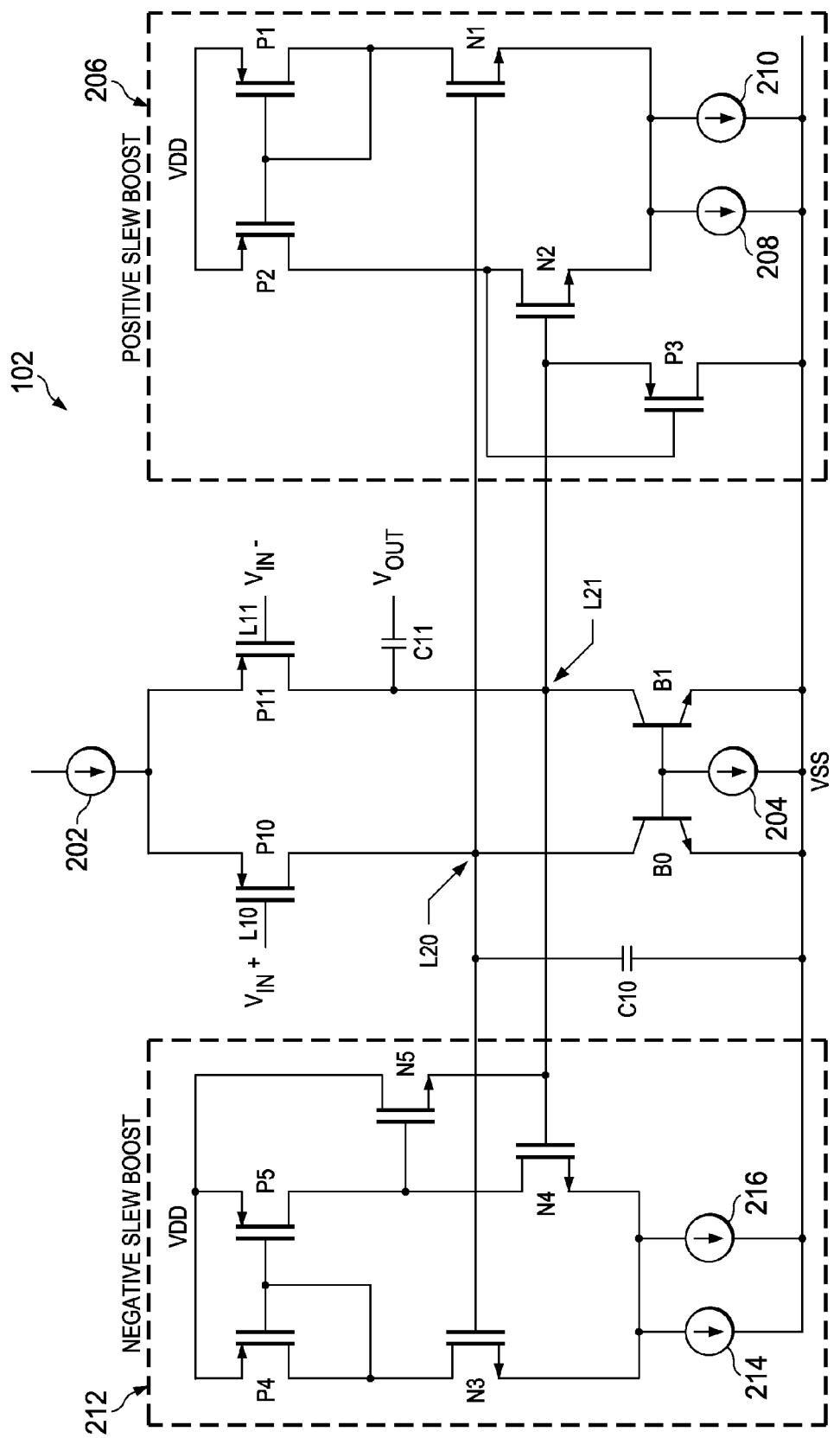
FIG. 2 is a schematic electrical circuit diagram of a first stage of the amplifier of FIG. 1.

FIG. 2 is a schematic electrical circuit diagram of the first stage 102. As shown in FIG. 2, the first stage 102 includes: (a) a p-channel field-effect transistor ("PFET") P10 whose gate is connected to L10; and (b) a PFET P11 whose gate is connected to L11. Respective sources of P10 and P11 are connected to one another and to a current source 202, so that the current source 202 supplies a current through P10 and P11. A drain of P10 is connected to L20. A drain of P11 is connected to L21.

L20 is connected to a collector of an NPN bipolar transistor B0. L21 is connected to a collector of an NPN bipolar transistor B1. Respective emitters of B0 and B1 are connected to VSS. Respective bases of B0 and B1 are connected to one another and are coupled through a current source 204 to VSS, so that: (a) the current source 204 supplies a current for controlling a current mirror that is formed by B0 and B1; and (b) such current mirror operates as a current source.

In the first stage 102, a positive slew boost circuit 206 includes: (a) an n-channel field-effect transistor ("NFET") N1 whose gate is connected to L20; and (b) an NFET N2 whose gate is connected to L21. Also, the circuit 206 includes a current mirror that is formed by PFETs P1 and P2. Respective sources of P1 and P2 are connected to a voltage supply node VDD. A drain of P1 is connected to respective gates of P1 and P2.

A drain of P2 is connected to a drain of N2 and to a gate of a PFET P3. A source of P3 is connected to L21, and a drain of P3 is connected to VSS. Drains of N1 and N2 are connected to one another and are coupled through current sources 208 and 210 to VSS, so that the current sources 208 and 210 together supply a total current through N1, N2, P1 and P2.

Moreover, in the first stage 102, a negative slew boost circuit 212 includes: (a) an NFET N3 whose gate is connected to L20; and (b) an NFET N4 whose gate is connected to L21. Also, the circuit 206 includes a current mirror that is formed by PFETs P4 and P5. Respective sources of P4 and P5 are connected to VDU. A drain of P4 is connected to respective gates of P4 and P5.

A drain of P5 is connected to a drain of N4 and to a gate of an NFET N5. A source of N5 is connected to L21, and a drain of N5 is connected to VDD, Drains of N3 and N4 are connected to one another and are coupled through current sources 214 and 216 to VSS, so that the current sources 214 and 216 together supply a total current through N3, N4, P4 and P5.

In the positive slew boost circuit 206, its $I_{TOTAL}$ is a sum of currents through the current sources 208 and 210. Similarly, in the negative slew boost circuit 212, its $I_{TOTAL}$ is a sum of currents through the current sources 214 and 216. In a first embodiment: (a) the transistors of the positive slew boost circuit 206 are matched, and its $I_{TOTAL} \approx I_{SLEW}$; and (b) similarly, the transistors of the negative slew boost circuit 212 are matched, and its $I_{TOTAL} \approx I_{SLEW}$. Accordingly, in the first embodiment, the positive slew boost circuit 206 and the negative slew boost circuit 212 are shut off in absence of the slew condition (because $I_{SLEW}=0$ in absence of the slew condition), which conserves power.

In a second embodiment, the transistors of the positive slew boost circuit 206 are intentionally mismatched, and the transistors of the negative slew boost circuit 212 are intentionally mismatched, which allows for easier implementation. In a first version of such embodiment, $I_{TOTAL} \approx I_{SLEW}$. In a second version of such embodiment, $I_{TOTAL} \sqrt{I_{CONST}}$, where $I_{CONST}$ is a relatively constant current. In a third version of such embodiment, $I_{TOTAL} \approx I_{SLEW} + I_{CONST}$.

In the first stage 102 operation, if $\Delta V_{IN}$ is a positive difference ($V_{IN}+ > V_{IN}-$), then less current from the source 202 flows through P10 and B0, and more current from the source 202 flows through P11 and B1 Conversely, if $\Delta V_{IN}$ is a negative difference ($V_{IN}+ < V_{IN}-$), then more current from the source 202 flows through P10 and B0, and less current from the source 202 flows through P11 and B1.

Positive slew boost refers to the positive slew condition, in which $V_{IN}+ > V_{IN}-$, so that $V_{20} < V_{21}$. In the positive slew condition, the positive slew boost circuit 206 lowers $V_{21}$ to constrain $\Delta V_2$ near its usual operating level. For example, as $I_{SLEW}$ causes $V_{20} < V_{21}$, more current flows through N2, because L21 is connected to the gate of N2.

As more current flows through N2, its drain voltage is lowered. As N2's drain voltage is lowered, more current flows through P3, because N2's drain is connected to the gate of P3. As more current flows through P3: (a) its source voltage is lowered; and (b) likewise, $V_{21}$ is lowered, because L21 is connected to the source of P3. This cycle progressively repeats until eventually: (a) current through P2 and N2 becomes substantially balanced with current through P1 and N1 (which is controlled by $V_{20}$ at the gate of N1); and (b) accordingly, $V_{21}$ becomes approximately equal to $V_{20}$, so that the positive slew boost circuit 206 thereby constrains $\Delta V_2$ near its usual operating level.

Negative slew boost refers to the negative slew condition, in which $V_{IN}+ < V_{IN}-$, so that $V_{20} > V_{21}$. In the negative slew condition, the negative slew boost circuit 212 raises $V_{21}$ to constrain $\Delta V_2$ near its usual operating level. For example, as $I_{SLEW}$ causes $V_{20} > V_{21}$, less current flows through N4, because L21 is connected to the gate of N4.

As less current flows through N4, its drain voltage is raised. As N4's drain voltage is raised, more current flows through N5, because N4's drain is connected to the gate of N5. As more current flows through N5: (a) its source voltage is raised; and (b) likewise, $V_{21}$ is raised, because L21 is connected to the source of N5. This cycle progressively repeats until eventually: (a) current through P5 and N4 becomes substantially balanced with current through P4 and N3 (which is controlled by $V_{20}$ at the gate of N3); and (b) accordingly, $V_{21}$ becomes approximately equal to $V_{20}$, so that the negative slew boost circuit 212 thereby constrains $\Delta V_2$ near its usual operating level.

In that manner, despite the positive or negative slew condition, the first stage 102 constrains $\Delta V_2$ near its usual operating level. After the slew condition ends ($I_{SLEW}=0$), the first stage 102 quickly settles $V_{20}$ and $V_{21}$ to their usual operating levels, because the amplifier 100 feedback quickly corrects for any remaining error. Accordingly: (a) in response to detecting the slew condition, the amplifier 100 generates slew current to maintain a high slew rate with class AB output; (b) $\Delta V_2$ is inherently stable before, during and after the slew condition; (c) the amplifier 100 has a relatively low settling time after the slew condition ends; and (d) the amplifier 100 consumes relatively low power (e.g., <10 nA).

By comparison, if a diode is placed between L20 and L21 to restrict a maximum difference between $V_{20}$ and $V_{21}$ during the slew condition, then the diode would have a voltage drop (e.g., 0.7 v). Such voltage drop would increase the amplifier 100 settling time after the slew condition ends.

Although illustrative embodiments have been shown and described by way of example, a wide range of alternative embodiments is possible within the scope of the foregoing disclosure.

What is claimed is:

1. An amplifier, comprising:
    a first stage for receiving a differential input voltage, which is formed by first and second input voltages, and outputting a first differential current in response thereto on first and second lines having respective first and second line voltages;
    a second stage coupled to the first stage for receiving the first and second line voltages and outputting a second differential current in response thereto on third and fourth lines having respective third and fourth line voltages;
    a third stage coupled to the second stage for receiving the third and fourth line voltages and outputting an output voltage in response thereto; and
    a slew boost circuit coupled to the third stage for detecting a slew condition, in which a threshold difference arises between the first and second input voltages, and outputting a slew current in response thereto for maintaining a slew rate of the output voltage during the slew condition, and wherein the slew current causes a variable difference to increase between the first and second line voltages;
    wherein the first stage includes: a first circuit for reducing the variable difference in response to the first line voltage exceeding the second line voltage; and a second circuit for reducing the variable difference in response to the second line voltage exceeding the first line voltage;

wherein the first circuit includes a first transistor whose gate is coupled to the first line, a second transistor whose gate is coupled to the second line, and a third transistor whose gate is coupled to a source/drain of the second transistor, and wherein the second line is coupled to a source/drain of the third transistor; and wherein the second circuit includes a fourth transistor whose gate is coupled to the first line, a fifth transistor whose gate is coupled to the second line, and a sixth transistor whose gate is coupled to a source/drain of the fifth transistor, and wherein the second line is coupled to a source/drain of the sixth transistor.

2. The amplifier of claim 1, wherein the first circuit includes at least a first current mirror coupled to the first and second transistors, and wherein the second circuit includes at least a second current mirror coupled to the fourth and fifth transistors.

3. The amplifier of claim 2, wherein the first circuit includes at least a first current source coupled to the first and second transistors, and wherein the second circuit includes at least a second current source coupled to the fourth and fifth transistors.

4. The amplifier of claim 3, wherein respective currents of the first and second current sources are approximately equal to the slew current.

5. The amplifier of claim 3, wherein the respective currents of the first and second current sources are relatively constant.

6. The amplifier of claim 3, wherein the respective currents of the first and second current sources are approximately equal to the slew current plus a relatively constant current.

7. The amplifier of claim 3, wherein the output voltage is coupled through a capacitor to the slew boost circuit, and wherein the slew current is for charging and discharging the capacitor.

8. The amplifier of claim 7, wherein the capacitor is a first capacitor, and wherein the output voltage is coupled through a second capacitor to the second line.

9. The amplifier of claim 7, wherein the output voltage is coupled through the capacitor to the third line.

10. The amplifier of claim 9, wherein the output voltage is coupled through a load to a voltage reference node.

11. A method, comprising:

with a first stage of an amplifier, receiving a differential input voltage, which is formed by first and second input voltages, and outputting a first differential current in response thereto on first and second lines having respective first and second line voltages;

with a second stage of the amplifier, receiving the first and second line voltages and outputting a second differential current in response thereto on third and fourth lines having respective third and fourth line voltages;

with a third stage of the amplifier, receiving the third and fourth line voltages and outputting an output voltage in response thereto; and with a slew boost circuit of the amplifier, detecting a slew condition, in which a threshold difference arises between the first and second input voltages, and outputting a slew current in response thereto for maintaining a slew rate of the output voltage during the slew condition, and wherein the slew current causes a variable difference to increase between the first and second line voltages;

with a first circuit of the first stage, reducing the variable difference in response to the first line voltage exceeding the second line voltage; wherein the first circuit includes a first transistor whose gate is coupled to the first line, a second transistor whose gate is coupled to the second line, and a third transistor whose gate is coupled to a source/drain of the second transistor, and wherein the second line is coupled to a source/drain of the third transistor; and with a second circuit of the first stage, reducing the variable difference in response to the second line voltage exceeding the first line voltage; wherein the second circuit includes a fourth transistor whose gate is coupled to the first line, a fifth transistor whose gate is coupled to the second line, and a sixth transistor whose gate is coupled to a source/drain of the fifth transistor, and wherein the second line is coupled to a source/drain of the sixth transistor.

12. The method of claim 11, wherein the first circuit includes at least a first current mirror coupled to the first and second transistors, and wherein the second circuit includes at least a second current mirror coupled to the fourth and fifth transistors.

13. The method of claim 12, wherein the first circuit includes at least a first current source coupled to the first and second transistors, and wherein the second circuit includes at least a second current source coupled to the fourth and fifth transistors.

14. The method of claim 13, wherein respective currents of the first and second current sources are approximately equal to the slew current.

15. The method of claim 13, wherein the respective currents of the first and second current sources are relatively constant.

16. The method of claim 13, wherein the respective currents of the first and second current sources are approximately equal to the slew current plus a relatively constant current.

17. The method of claim 13, wherein the output voltage is coupled through a capacitor to the slew boost circuit, and wherein the slew current is for charging and discharging the capacitor.

18. The method of claim 17, wherein the capacitor is a first capacitor, and wherein the output voltage is coupled through a second capacitor to the second line.

19. The method of claim 17, wherein the output voltage is coupled through the capacitor to the third line.

20. The method of claim 19, wherein the output voltage is coupled through a load to a voltage reference node.

* * * * *